United States Patent [19]
Kitamura et al.

[11] Patent Number: 6,007,633
[45] Date of Patent: Dec. 28, 1999

[54] SINGLE-SUBSTRATE-PROCESSING APPARATUS IN SEMICONDUCTOR PROCESSING SYSTEM

[75] Inventors: Masayuki Kitamura, Fuchu; Harunori Ushikawa, Sagamihara, both of Japan

[73] Assignee: Tokyo Electron Limited, Tokyo, Japan

[21] Appl. No.: 09/056,627

[22] Filed: Apr. 8, 1998

[30]       Foreign Application Priority Data

Apr. 9, 1997 [JP] Japan ................................... 9-106761

[51] Int. Cl.⁶ ................................................. C23C 16/00
[52] U.S. Cl. ........................... 118/724; 118/50; 118/50.1; 118/725; 118/728
[58] Field of Search ............................ 118/50, 50.1, 724, 118/725, 728

[56]            References Cited

U.S. PATENT DOCUMENTS 5,683,518  11/1997  Moore et al. ..................... 118/50.1 X
5,781,693   7/1998  Ballance et al. ................... 118/724 X

*Primary Examiner*—Leo B. Tentoni
*Attorney, Agent, or Firm*—Oblon, Spivak, McClelland, Maier & Neustadt, P.C.

[57]            ABSTRACT

The process chamber of a thermal CVD apparatus for a semiconductor wafer W has flooring and ceiling plates made of quartz. Lower and upper heaters are arranged behind the flooring and ceiling plates. The supply for supplying a process gas into the process chamber has a shower head directly under the ceiling plate, an outer tube surrounding the shower head, and radial tubes connecting the outer tube and the shower head. The shower head is made of quartz, and its top bottom and top plates can transmit radiation heat from the upper heater.

20 Claims, 3 Drawing Sheets

000
SINGLE-SUBSTRATE-PROCESSING APPARATUS IN SEMICONDUCTOR PROCESSING SYSTEM

BACKGROUND OF THE INVENTION

The present invention relates to a single-substrate-processing apparatus in a semiconductor processing system, and, particularly, to an improvement in a shower head used in the single-substrate-processing apparatus. The term "semiconductor processing" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

There are CVD (Chemical Vapor Deposition) methods known as semiconductor processing methods of forming a film on a target substrate. Single-substrate-processing CVD apparatuses for processing semiconductor wafers one by one include a single-side-heating type of heating each wafer from the bottom side, and a double-side-heating type of heating each wafer from both the top and bottom sides.

Generally, a CVD apparatus of the single-side-heating type has a resistance heating body incorporated within a worktable, for heating a wafer only from the bottom side. Accordingly, there is a certain space above the wafer, large enough to arrange therein a shower head having a thickness of about 60 mm for supplying a process gas. The shower head has a void space in which a plurality of horizontal distribution plates are arranged, for uniformly distributing the process gas. A gas supply pipe is connected to the top of the shower head to communicate with the void space. There are a number of gas supply holes formed on the bottom of the shower head. The process gas is uniformly distributed in the void space by the horizontal distribution plates while it flows from the gas supply pipe to the gas supply holes.

On the other hand, a conventional CVD apparatus of the double-side-heating type has a structure as shown in FIG. 6. The apparatus is provided with a resistance heating body 11 arranged in a worktable 10 and heating means 12 arranged above the worktable 10 to face a wafer W. The wafer W is heated from both the top and bottom sides by the resistance heating body 11 and the heating means 12. Two gas supply pipes 13 and 14 are arranged to penetrate the left and right side walls of a process chamber and to have openings between the worktable 10 and the heating means 12. A process gas is supplied through the gas supply pipes 13 and 14, while the wafer W is heated from the top and bottom sides and the process chamber is exhausted through an exhaust pipe 15, so that a predetermined thin film is formed on the wafer W.

Sine the CVD apparatus of the double-side-heating type has the heating means 12 above the wafer W, it is difficult to use a shower head for the process gas, such as one used in the CVD apparatus of the single-side-heating type, in light of limits in space and in heat transmission. For this reason, as shown in FIG. 6, the process gas is supplied through the gas supply pipes 13 and 14 arranged at two positions above the peripheral portion of the wafer W. However, there is no means for uniformly distributing the process, and thus the process gas is apt to be supplied from the gas supply pipes 13 and 14 to the wafer W less uniformly.

Besides, the process gas is supplied in the process chamber at room temperature and hinders the surface of the wafer W in being heated by the heating means 12. Where the process gas is less uniformly distributed, so is a degree of hindering the heating of the wafer W, thereby lowering planar uniformity of the temperature of the wafer. As a result, a film formation process performed by the apparatus shown in FIG. 6 ends up as a less uniform process.

In order to solve this problem, there are ideas such that the gas supply pipes 13 and 14 are alternately caused to supply the process gas, and/or the wafer W is rotated during the process, so that the process gas is uniformly distributed. However, these ideas cannot increase uniformity in distribution of the gas so much. Further, these ideas require the gas supply pipes 13 and 14 to be provided with control valves for controlling their opening/closing, and/or the worktable to be provided with a rotating mechanism for rotating the wafer W, thereby making the apparatus complicated.

BRIEF SUMMARY OF THE INVENTION

An object of the present invention is to provide a single-substrate-processing apparatus in a semiconductor processing system, having process gas supply means which can be arranged in a height-limited space, and can uniformly supply a process gas.

Another object of the present invention is to provide a single-substrate-processing apparatus in a semiconductor processing system, having process gas supply means which has a simple structure suitable for the double-side-heating type, and can uniformly supply a process gas.

According to a first aspect of the present invention, there is provided a single-substrate-processing apparatus in a semiconductor processing system, comprising:

an airtight process chamber;

a support arranged in the process chamber, for supporting a target substrate;

an exhaust for exhausting the process chamber; and a supply for supplying a process gas into the process chamber, the supply comprising a shower head arranged in the process chamber, an outer tube arranged around the shower head, and a plurality of connecting tubes arranged at intervals to connect the outer tube to the shower head, the shower head comprising a flat and hollow casing, which has a bottom plate facing the substrate on the support and having a plurality of gas supply holes formed therein, and a top plate facing the bottom plate, the process gas being supplied from the outer tube into the shower head through the connecting tubes.

According to a second aspect of the present invention, there is provided a single-substrate-processing apparatus in a semiconductor processing system, comprising:

an airtight process chamber having a flooring plate and a ceiling plate, which are heat-resistant and transparent;

a support arranged in the process chamber, for supporting a target substrate;

an exhaust for exhausting the process chamber;

a supply for supplying a process gas into the process chamber, the supply comprising a shower head arranged in the process chamber, the shower head comprising a flat and hollow casing, which has a bottom plate facing the substrate on the support and having a plurality of gas supply holes formed therein, and a top plate facing the bottom plate, the bottom plate and the top plate being heat-resistant and transparent;

a lower heater arranged below the flooring plate of the process chamber for heating the substrate through the flooring plate; and an upper heater arranged above the ceiling plate of the process chamber for heating the substrate through the ceiling plate, and the bottom plate and the top plate of the shower head.

DETAILED DESCRIPTION OF THE INVENTION

Figure 1:
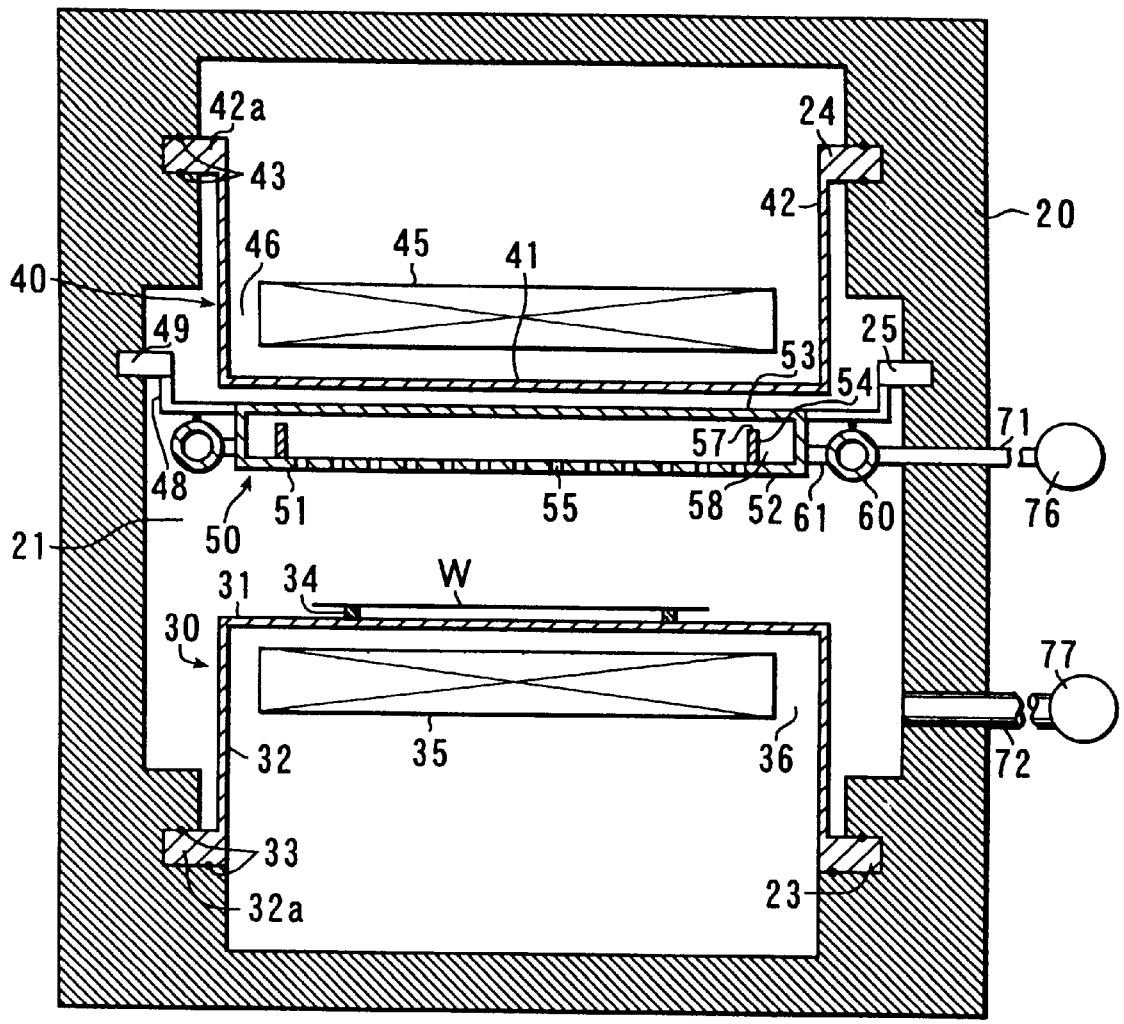
FIG. 1 is a cross-sectional front view showing a thermal CVD apparatus according to an embodiment of the present invention.

FIG. 1 is a cross-sectional front view showing a thermal CVD apparatus according to an embodiment of the present invention.

The CVD apparatus has a common container 20 formed of a cylindrical metal body. A lower cylindrical body 30 and upper cylindrical body 40 are airtightly mounted on the inner surface of the common container 20, and an airtight process chamber 21 having a cylindrical shape is defined between the cylindrical bodies 30 and 40. Each of the cylindrical bodies 30 and 40 is an integratedly formed article made of quartz ($SiO_2$), which is a heat-resistant and transparent material, or another heat-resistant and transparent material, such as sapphire ($Al_2O_3$).

The lower cylindrical body 30 has a horizontal circular plate 31 and a cylindrical plate 32 extending downward from the circular plate 31. An annular flange portion 32a is formed at the bottom end of the cylindrical plate 32. The flange portion 32a is inserted in and fixed to an annular groove 23 formed in the inner surface of the common container 20. O-rings 33 extending all around are arranged in the upper and lower face-contacting portions between the flange portion 32a and groove 23, so as to ensure airtightness of the process chamber 21.

The upper cylindrical body 40 has a horizontal circular plate 41 and a cylindrical plate 42 extending upward from the circular plate 41. An annular flange portion 42a is formed at the top end of the cylindrical plate 42. The flange portion 42a is inserted in and fixed to an annular groove 24 formed in the inner surface of the common container 20. O-rings 43 extending all around are arranged in the upper and lower face-contacting portions between the flange portion 42a and groove 24, so as to ensure airtightness of the process chamber 21.

In other words, the process chamber 21 is designed such that its flooring and ceiling plates are formed essentially of the horizontal circular plates 31 and 41 of the lower and upper cylindrical bodies 30 and 40, respectively, and its lateral side plate is formed of the cylindrical side wall of the common container 20.

The horizontal circular plate 31 of the lower cylindrical body 30, i.e., the flooring plate 31 of the process chamber 21, is provided with support pins 34 at three positions thereon, for horizontally supporting a semiconductor wafer W to be separated from the flooring plate 31. The support pins 34 are made of a heat-resistant material, such as quartz, and supported by the flooring plate 31 at their bottom ends.

A lower heater 35 formed of a heating lamp is disposed under the flooring plate 31, i.e., in the hollow 36 of the lower cylindrical body 30. The bottom surface of the wafer W mounted on the support pins 34 is heated with radiation heat from the lower heater 35 through the flooring plate 31. An upper heater 45 formed of a heating lamp is disposed above the ceiling plate 41, i.e., in the hollow 46 of the upper cylindrical body 40. The top surface of the wafer W mounted on the support pins 34 is heated with radiation heat from the upper heater 45 through the ceiling plate 41. The lower and upper heaters 35 and 45 may be formed of resistance heating bodies in place of the heating lamps.

Figure 3:
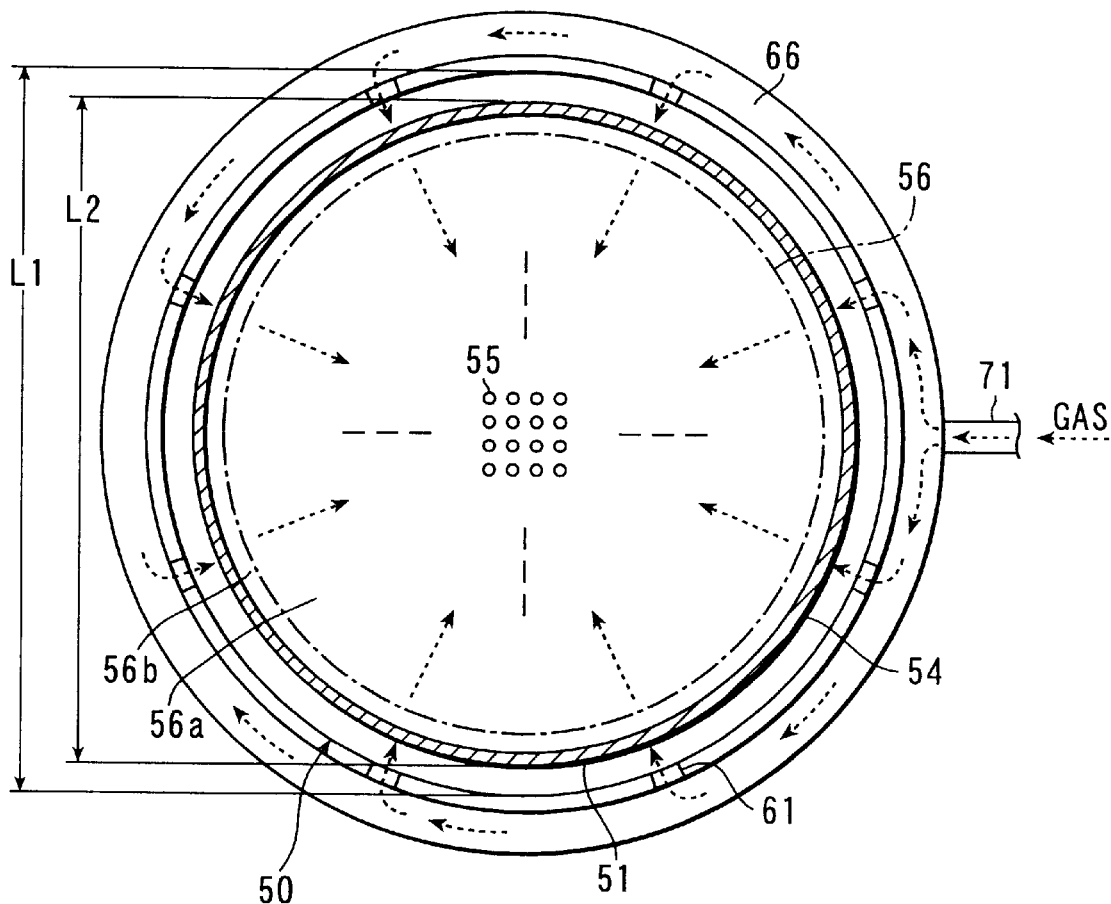
FIG. 3 is a cross-sectional plan view showing the shower head and so forth shown in FIG. 2.

A shower head 50 is arranged in the process chamber 21, for supplying a process gas into the process chamber 21. As shown in FIG. 3, the shower head 50 is formed of a flat and cylindrical hollow casing 51 made of quartz, which is a heat-resistant and transparent material, or another heat-resistant and transparent material, such as sapphire. The hollow casing 51 has a bottom plate 52 and a top plate 53 each arranged horizontally. In terms of dimensions of the casing 51 shown in FIGS. 3 and 4, for example, the outer diameter L1 is set at 360 mm, the inner thickness (vertical length) T1 at 19 mm.

A number of gas supply holes 55 are formed in the bottom plate 55 of the shower head 50 to face the wafer W mounted on the support pins 34. For example, the gas supply holes 55 are formed to have an inner diameter of 3 mm, with pitch of 12 mm. The bottom plate 52 has a shower region 56a, in which the gas supply holes 56a are formed substantially all over, and a marginal region 56b surrounding the shower region 56a and having no gas supply holes 55 formed therein. In FIG. 3, the borderline 56 between the two regions 56a and 56b is indicated with a one-dot chain line. The shower region 56a has a size and an arrangement such that the region 56a is substantially coaxial with the wafer W mounted on the support pins 34, and the planarly projected contour of the wafer W is positioned therein.

The shower head 50 is attached to the common container 20 by a circular support frame 48 made of a heat-resistant material, such as quartz, and welded to the casing 51. The frame 48 has an annular flange portion 49 at its end, which is inserted in and fixed to an annular groove 25 formed in the inner surface of the common container 20.

A baffle plate 54 for distributing the process gas, i.e., distributing means, is arranged in the shower head 50 to correspond to the marginal region 56b, i.e., the outside of the borderline 56 between the regions 56a and 56b. The baffle plate 54 is formed of a endless ring plate made of a heat-resistant material, such as quartz, and arranged to be coaxial with the shower region 56a. The bottom end of the ring plate is welded to the bottom plate 52 of the shower head 50.

Figure 4:
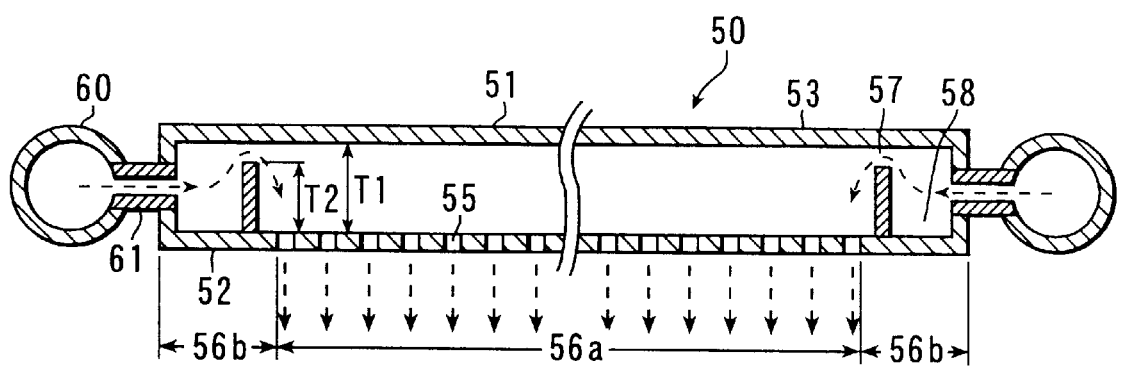
FIG. 4 is a cross-sectional side view showing the shower head and so forth shown in FIG. 2.

In terms of dimensions of the baffle plate 54 shown in FIGS. 3 and 4, for example, the outer diameter L2 is set at 320 mm, the height T2 at 17 mm. Specifically, in this case, a gap 57 as small as about 2 mm is formed between the baffle plate 54 and the top plate 53 of the shower head 50. Further, an annular flow passageway 58 having a width of about 40 mm is formed between the baffle plate 54 and the lateral side plate of the shower head 50.

An outer tube 60 is arranged around the shower head 50, for supplying the process gas. The outer tube 60 is formed of an endless ring tube made of a heat-resistant material, such as quartz. The outer tube 60 has an inner diameter of 16.5 mm and is horizontally arranged to be coaxial with the shower head 50. The outer tube 60 is supported by the support frame 48 such that its top is welded to the bottom of the support frame 48.

The outer tube 60 and the shower head 50 communicate with each other through a plurality of radial tubes 61. The radial tubes 61 are formed of tubes made of a heat-resistant material, such as quartz. The radial tubes 61 have an inner diameter of 4 mm and are horizontally arranged at eight equidistant positions around the shower head 50.

A gas supply pipe 71 is connected to the outer tube 60 at one position on the outer side surface of the tube 60. The gas supply pipe 71 airtightly penetrates the lateral side wall of the common container 20 and is connected to a process gas source 76. Accordingly, the process gas from the process gas source 76 is supplied into the shower head 50 through the gas supply pipe 71, the outer tube 60, and the radial tubes 61, and is further supplied into the process chamber 21 through the gas supply holes 55.

Exhausting means is connected to the lower side of the process chamber 21, for exhausting the process chamber 21 and setting it at vacuum. The exhausting means pen an exhaust pipe 72 which airtightly penetrates the lateral side wall of the common container 20 and is connected to the process chamber 21. The exhaust pipe 72 is connected to a vacuum exhaust mechanism 77 including a vacuum pump and the like.

Figure 2:
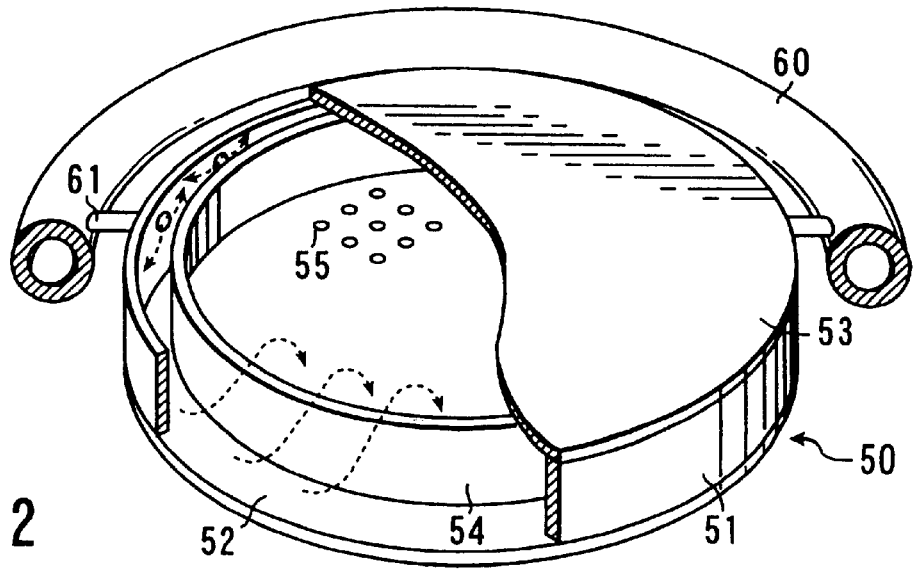
FIG. 2 is a partly cut-out perspective view showing a shower head for supplying a process gas and so forth in the apparatus shown in FIG. 1.

In the CVD apparatus according to this embodiment, the process gas supplied from the gas supply pipe 71 into the outer tube 60 flows within the outer tube 60 in an angular direction, as indicated with a broken line in FIGS. 2 and 3. Since the outer tube 60 has an inner diameter of 16.5 mm, and thus has a large conductance, the process gas easily flows over to the side opposite to the gas supply pipe 71. Since the radial tubes 61 are arranged at eight equidistant positions, the process gas flows into the shower head 50 uniformly from the eight positions.

The flows of the process gas fed from the radial tubes 61 into the shower head 50 first collide with the baffle plate 54. With this collision, the flows of the process gas not only proceed onto the shower region 56a through the gap 57 between the top plate 53 and the baffle plate 54, but also each are divided into two flows in opposite lateral directions. In other words, the flows of the process gas are divided by the collision with the baffle plate 54, and spread toward left and right sides along the annular flow passageway 58 between the lateral side wall of the shower head 50 and the baffle plate 54. The gas flows from the radial tubes 61 at the eight positions are mixed in the annular flow passageway 58, and pass over the baffle plate 54 onto the shower region 56a.

The gap between the top end of the baffle plate 54 and the top plate 53 of the shower head 50 is set at about 2 mm to have a small conductance. Consequently, the process gas sufficiently stays in the annular flow passageway 58 to spread in an angular direction and then flow over the baffle plate 54 onto the shower region 56a. As a result, the process gas flows onto the shower region 56a uniformly from the periphery, and is supplied into the process chamber 21 through the gas supply holes 55. It follows that this embodiment provides a high uniformity in the distribution of gas supply amount from the gas supply holes 55.

Figure 5A:
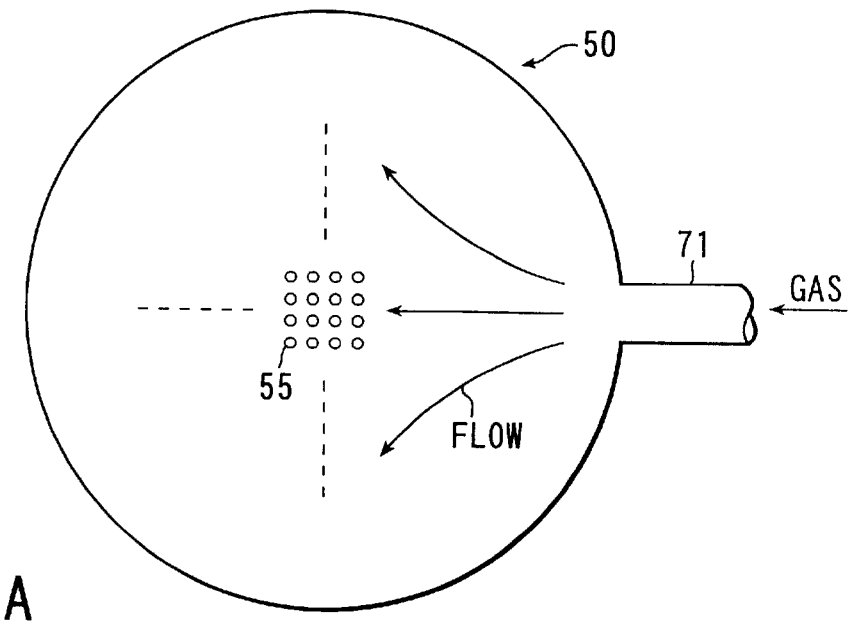
FIGS. 5A and 5B are a plan view and a cross-sectional side view, respectively, showing a comparative shower head of related art.
Figure 5B:
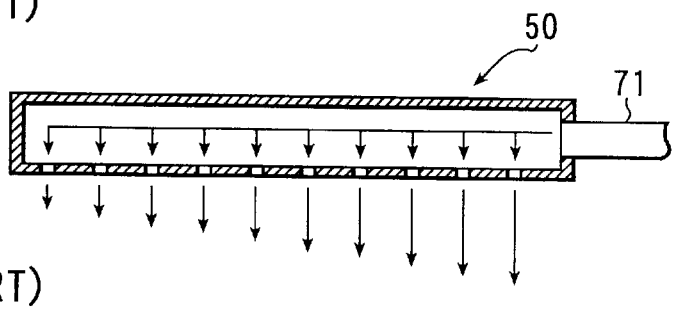
Figure 6:
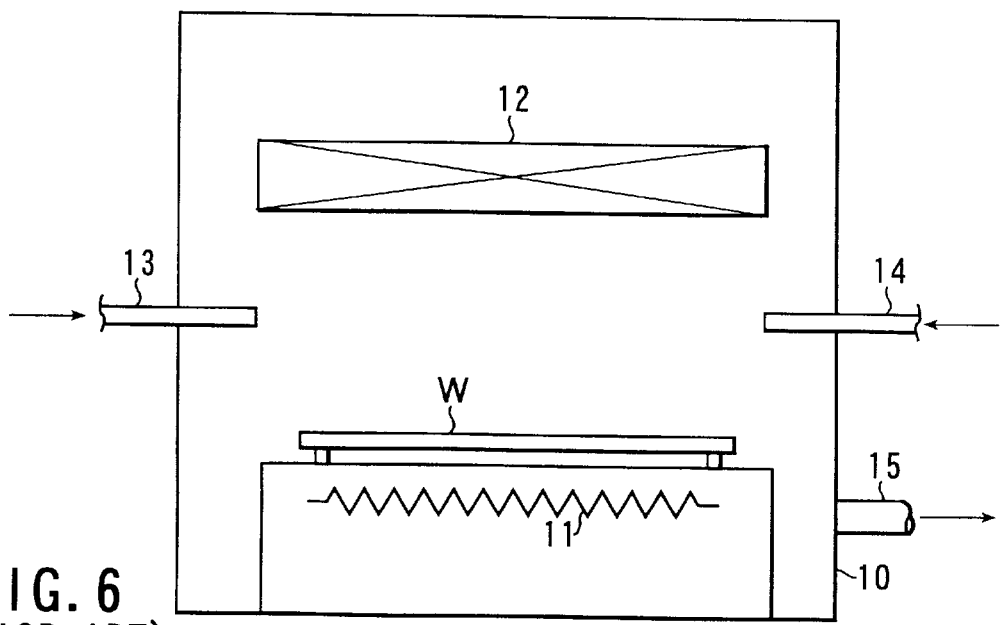
FIG. 6 is a schematic front view showing a conventional CVD apparatus of the double-side-heating type.

In contrast, where a structure shown in FIGS. 5A and 5B are adopted, the following problem arises. Specifically, where a process gas is directly supplied from a gas supply pipe 71 into a shower head 50, the process gas flows from the inlet side (the side connected to the supply pipe 71) to the other side (the distal side) in a manner shown in FIG. 5A. Since the process gas flows out through gas supply holes 55 in sequence from the inlet side, a gradient in gas flow rate is caused in the shower head 50 such that the gas flow rate is gradually decreased toward the other side. As a result, the amount of gas flowing out through the gas supply holes 55 is gradually decreased from the inlet side to the distal side, as shown in FIG. 5B. Therefore, the structure shown in FIGS. 5A and 5B cannot provide a high uniformity in the distribution of gas supply amount from the gas supply holes 55.

Further, assume that only the baffle plate 54 is omitted from the structure of the embodiment shown in FIGS. 1 to 4. In this case, the amount of the gas flowing through the gas supply holes 55 is large near radial tubes 61 and is gradually decreased away from the radial tubes 61. Therefore, such a structure also cannot provide a high uniformity in the distribution of gas supply amount from the gas supply holes 55.

Back to the embodiment of the present invention, the wafer W mounted on the support pins 34 is heated by the lower heater 35 from the bottom, and by the upper heater 45 from the top. Although the shower head 50 exists between the upper heater 45 and the wafer W, the bottom plate 52 and the top plate 53 are transparent. Consequently, radiation heat from the upper heater 45 is transmitted through the ceiling plate 41 of the process chamber 21 and the top and bottom plate 53 and 52 of the shower head 50, so that the wafer W is heated therewith.

Further, before being supplied into the process chamber 41, the process gas is pre-heated in the outer tube 60, the radial tubes 61, and the shower head 50 by the upper heater 45. The members constituting the gas passage, such as the outer tube 60 and the shower head 50, are disposed directly under the upper heater 45, and they are heated up to a relatively high temperature. The gas passage of the process gas is made long by the radial tubes 61 and the baffle plate 54, and the gas is exposed to radiation heat from the upper heater 45 for a relatively long time. With this arrangement, the process gas supplied into the outer tube 60 at room temperature is sufficiently pre-heated, while it flows through the gas passage onto the wafer W.

The pre-heated process gas is supplied through the shower head 50, while the wafer W mounted on the support pins 34 is heated from below and above by non-contact heating, as described above, so that a thin film is formed on the wafer W by means of thermal CVD. During this process, the vacuum exhaust mechanism 77 continues to exhaust the process chamber 21, so that the process chamber 21 is kept at a predetermined vacuum.

According to this embodiment, the process gas is distributed in an angular direction by the outer tube 60, and is further distributed by lowering the gas flow speed by the baffle plate 54, thereby allowing the gas flow to be uniform, as described above. As a result, the process gas can be uniformly supplied onto the wafer by the simple structure, without controlling supply of the process gas from the gas supply pipe or rotating the wafer W. In addition, since there are no horizontal distribution plates used for distributing the gas in the shower head 50, the shower head 50 is allowed to have a thickness smaller than the conventional one by about 19 mm.

Further, since the process gas is pre-heated, the difference in temperatures between the wafer W and the process gas is small, when the process gas flows out of the shower head 50. This contributes, along with the uniform gas flow, to an improvement in uniformity of the temperature distribution of the wafer. In other words, planar uniformity in the temperature of the wafer W is increased, thereby improving uniformity in the process.

Furthermore, the shower head 50 can be easily fabricated, because it is designed such that the process gas is caused to pass through the gap formed above the baffle plate 54 and thus to be distributed. Instead, assume that, for example, a baffle plate having a through hole is used and its top and bottom ends are welded to the bottom plate 52 and the top plate 53 of the shower head 50. This structure is not easily fabricated.

Note that the feature of the process gas supply means residing in the combination of the shower head 50, the outer tube 60, and the radial tubes 61 may be applied to a processing apparatus other than the apparatus in which a wafer is heated from the top and bottom sides. Specifically, this feature may be applied to a processing apparatus in which a wafer is heated from only one side, or in which a process is performed without heating a wafer, such as etching.

The feature of the process gas supply means residing in the combination of the transparent top and bottom plates 53 and 52 of the shower head 50 may be applied to a structure having no outer tube 60, no radial tubes 61, or no baffle plate 54. Specifically, in this case, the process gas may be supplied from the gas supply pipe 71 directly into the shower head 50, which has no baffle plate 54 therein. The radial tubes 61 may be arranged to be non-equidistant and have different inner diameters. The radial tubes 61 can be respectively designed for their positions and inner diameters in light of ways of distributing the process gas.

We claim:

1. A single-substrate-processing apparatus in a semiconductor processing system, comprising:
    an airtight process chamber;
    a support arranged in said process chamber, for supporting a target substrate;
    an exhaust for exhausting said process chamber; and
    a supply for supplying a process gas into said process chamber, said supply comprising a shower head arranged in said process chamber, an outer tube arranged around said shower head, and a plurality of connecting tubes arranged at intervals to connect said outer tube to said shower head, said shower head comprising a flat and hollow casing, which has a bottom plate facing said substrate on said support and having a plurality of gas supply holes formed therein, and a top plate facing said bottom plate, said process gas being supplied from said outer tube into said shower head through said connecting tubes.

2. The apparatus according to claim 1, wherein said bottom plate of said shower head has a shower region, in which said gas supply holes are formed substantially all over, and a marginal region surrounding said shower region, and wherein distributing means for distributing said process gas is arranged in said shower head to correspond to said marginal region.

3. The apparatus according to claim 2, wherein said distributing means comprises a baffle plate fixed to only one of said bottom plate and said top plate of said shower head.

4. The apparatus according to claim 3, wherein said baffle plate is fixed to said bottom plate of said shower head.

5. The apparatus according to claim 4, wherein said bottom plate and said top plate of said shower head face each other with no solid layer interposed therebetween, in a planarly projected contour of said substrate supported by said support.

6. The apparatus according to claim 5, wherein said shower region has a size and an arrangement such that said planarly projected contour of said substrate is positioned in said shower region.

7. The apparatus according to claim 1, wherein said connecting tubes are equidistantly arranged.

8. The apparatus according to claim 2, wherein said process chamber has a flooring plate and a ceiling plate, which are heat-resistant and transparent, while said bottom plate and said top plate are heat-resistant and transparent, and wherein said apparatus comprises a lower heater arranged below said flooring plate of said process chamber for heating said substrate through said flooring plate, and an upper heater arranged above said ceiling plate of said process chamber for heating said substrate through said ceiling plate, and said bottom plate and said top plate of said shower head.

9. The apparatus according to claim 8, wherein each of said flooring plate and said ceiling plate of said process chamber, and said bottom plate and said top plate of said shower head consists essentially of a material selected from a group consisting of quartz and sapphire.

10. The apparatus according to claim 8, wherein said substrate is supported by said support such that said substrate is out of contact with said flooring plate and said ceiling plate of said process chamber.

11. A single-substrate-processing apparatus in a semiconductor processing system, comprising:
    an airtight process chamber having a flooring plate and a ceiling plate, which are heat-resistant and transparent;
    a support arranged in said process chamber, for supporting a target substrate;
    an exhaust for exhausting said process chamber;
    a supply for supplying a process gas into said process chamber, said supply comprising a shower head arranged in said process chamber, said shower head comprising a flat and hollow casing, which has a bottom plate facing said substrate on said support and having a plurality of gas supply holes formed therein, and a top plate facing said bottom plate, said bottom plate and said top plate being heat-resistant and transparent;
    a lower heater arranged below said flooring plate of said process chamber for heating said substrate through said flooring plate; and
    an upper heater arranged above said ceiling plate of said process chamber for heating said substrate through said ceiling plate, and said bottom plate and said top plate of said shower head.

12. The apparatus according to claim 11, wherein each of said flooring plate and said ceiling plate of said process chamber, and said bottom plate and said top plate of said shower head consists essentially of a material selected from a group consisting of quartz and sapphire.

13. The apparatus according to claim 12, wherein said bottom plate of said shower head has a shower region, in which said gas supply holes are formed substantially all over, and a marginal region surrounding said shower region, and wherein distributing means for distributing said process gas is arranged in said shower head to correspond to said marginal region.

14. The apparatus according to claim 13, wherein said bottom plate and said top plate of said shower head face each other with no solid layer interposed therebetween, in a planarly projected contour of said substrate supported by said support.

15. The apparatus according to claim 14, wherein said shower region has a size and an arrangement such that said planarly projected contour of said substrate is positioned in said shower region.

16. The apparatus according to claim 15, wherein said flooring plate and said ceiling plate of said process chamber, and said bottom plate and said top plate of said shower head are substantially horizontal, while said substrate is supported by said support to be substantially horizontal.

17. The apparatus according to claim 16, wherein said substrate is supported by said support such that said substrate is out of contact with said flooring plate and said ceiling plate of said process chamber.

18. The apparatus according to claim 11, wherein said flooring plate and said ceiling plate of said process chamber are mounted on a common container to define said process chamber which has a lateral side wall formed of part of said common container.

19. The apparatus according to claim 18, wherein said lower heater and said upper heater are arranged in said common container.

20. The apparatus according to claim 19, wherein each of said lower heater and said upper heater comprises a heating lamp.

* * * * *